(12) United States Patent
Elkholy et al.

(10) Patent No.: US 9,281,823 B2
(45) Date of Patent: Mar. 8, 2016

(54) SINGLE INSERTION TRIMMING OF HIGHLY ACCURATE REFERENCE OSCILLATORS

(71) Applicant: Si-Ware Systems, La Canada Flintridge, CA (US)

(72) Inventors: Ahmed Elkholy, Corvalis, OR (US); Ayman Ahmed, Cairo (EG)

(73) Assignee: Si-Ware Systems, Cairo (EG)

( * ) Notice: Subject to any disclaimer, the term of this patent is extended or adjusted under 35 U.S.C. 154(b) by 0 days.

(21) Appl. No.: 14/183,799

(22) Filed: Feb. 19, 2014

(65) Prior Publication Data

US 2014/0232475 A1 Aug. 21, 2014

Related U.S. Application Data

(60) Provisional application No. 61/766,773, filed on Feb. 20, 2013.

(51) Int. Cl.
| | |
|---|---|
| *H03L 1/04* | (2006.01) |
| *H03L 7/085* | (2006.01) |
| *H03L 1/02* | (2006.01) |
| *H03L 7/099* | (2006.01) |
| *H03L 7/16* | (2006.01) |

(52) U.S. Cl.
CPC .............. *H03L 1/026* (2013.01); *H03L 1/027* (2013.01); *H03L 1/04* (2013.01); *H03L 7/085* (2013.01); *H03L 7/099* (2013.01); *H03L 7/16* (2013.01); *H03L 2207/06* (2013.01); *H03L 2207/50* (2013.01)

(58) Field of Classification Search
CPC ........... H03L 1/02; H03L 1/022; H03L 1/026; H03L 1/04; H03L 7/06; H03L 7/085; H03L 7/087; H03L 7/093

USPC ............. 331/147, 156, 10, 11, 16, 17, 44, 66, 331/176; 375/373, 375, 376
See application file for complete search history.

(56) References Cited

U.S. PATENT DOCUMENTS

| | | | | |
|---|---|---|---|---|
| 4,069,462 | A * | 1/1978 | Dunn .............................. | 331/11 |
| 5,381,116 | A * | 1/1995 | Nuckolls et al. .............. | 331/1 A |
| 6,078,224 | A * | 6/2000 | Ujiie ............................... | 331/10 |
| 6,362,700 | B1 * | 3/2002 | Fry ................................. | 331/176 |
| 6,784,756 | B2 * | 8/2004 | Villella ........................... | 331/176 |
| 7,042,301 | B2 * | 5/2006 | Sutardja ........................ | 331/176 |
| 7,782,147 | B2 * | 8/2010 | Anderson et al. .............. | 331/69 |
| 2009/0072911 | A1 * | 3/2009 | Ke et al. ......................... | 331/16 |
| 2009/0102570 | A1 * | 4/2009 | Yoshida et al. ............... | 331/1 R |
| 2009/0115536 | A1 * | 5/2009 | Dai et al. ........................ | 331/44 |
| 2012/0139593 | A1 * | 6/2012 | Saito ............................. | 327/156 |
| 2013/0200932 | A1 * | 8/2013 | Yang et al. .................... | 327/157 |

\* cited by examiner

*Primary Examiner* — Levi Gannon
(74) *Attorney, Agent, or Firm* — Useful Arts IP

(57) ABSTRACT

A highly integrated monolithic self-compensated oscillator (SCO) with high frequency stability versus temperature variations is described, together with a cost effective single insertion point trimming (SPT) algorithm. The SPT is utilized to adjust the phase and frequency of the SCO to meet frequency stability versus temperature and frequency accuracy requirements for a reference clock. The techniques used in the SPT algorithm provide a robust, fast and low testing cost for the SCO. Moreover, the concepts and techniques utilized in the SCO SPT can be used effectively for any temperature compensated oscillator (TCO) including TCXO, MEMS, FBAR and RC oscillators. Additionally, the described SPT algorithm is capable of measuring the temperature sensitivity of any oscillator, estimating suitable temperature compensation parameters and adjusting the oscillator frequency to the required value simultaneously.

16 Claims, 16 Drawing Sheets

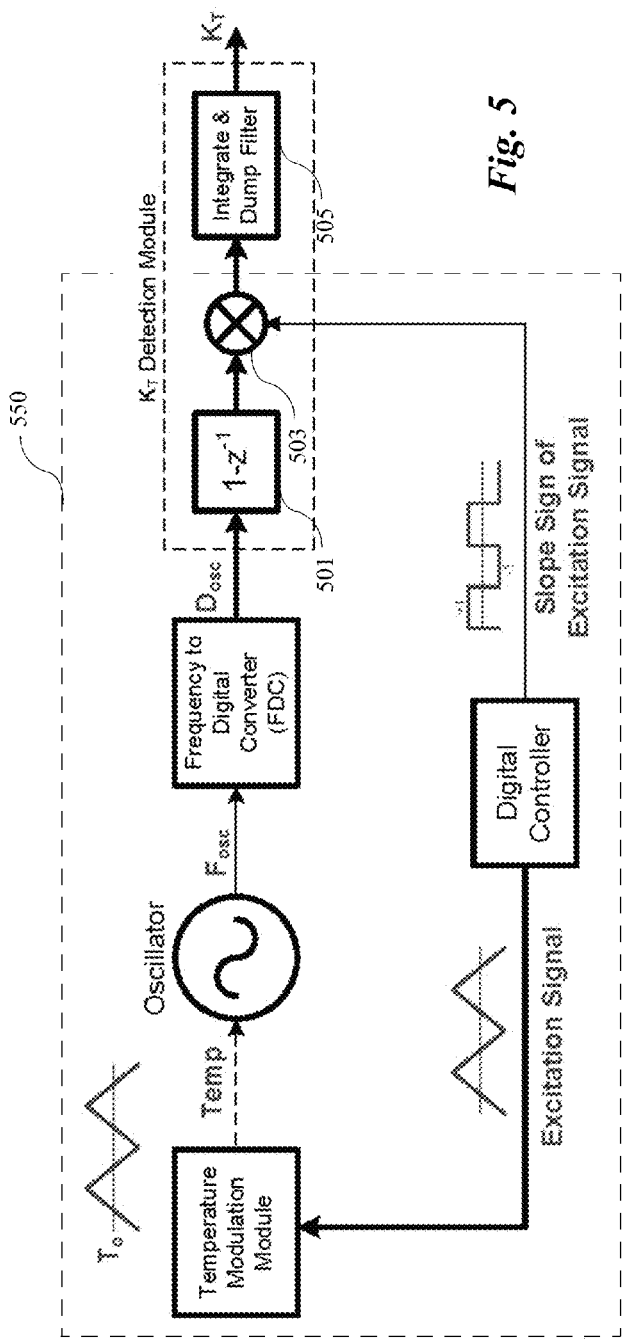
*Fig. 5*
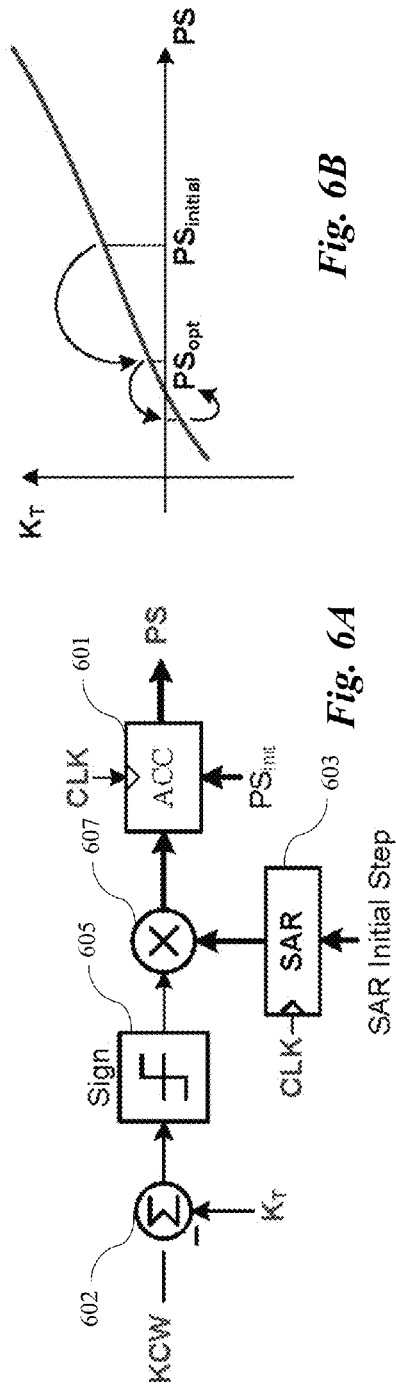
*Fig. 6B*
*Fig. 6A*

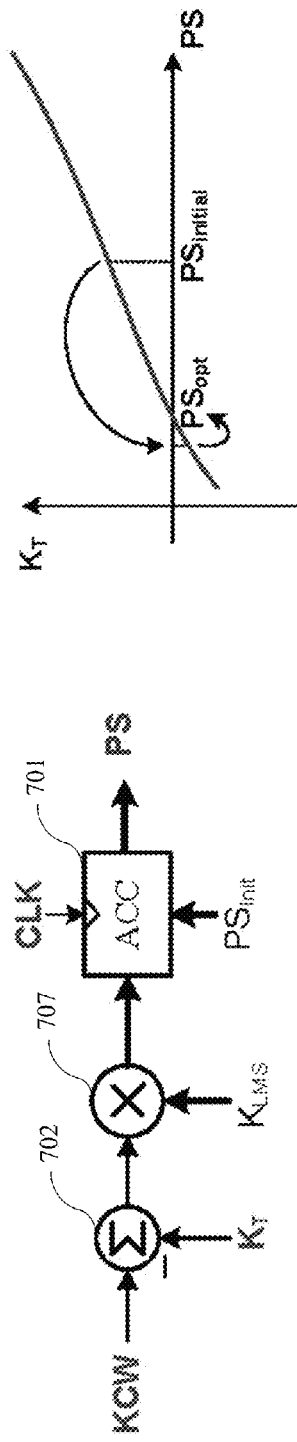
*Fig. 7A*
*Fig. 7B*
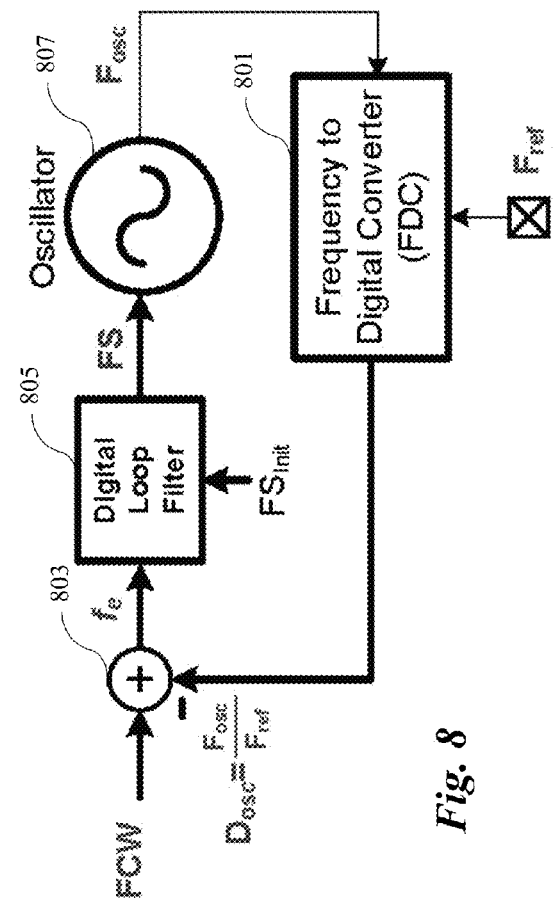
*Fig. 8*

SINGLE INSERTION TRIMMING OF HIGHLY ACCURATE REFERENCE OSCILLATORS

BACKGROUND

The techniques described relate to the trimming and calibration of oscillators, and more particularly highly accurate oscillators which can serve as clock references in electronic platforms.

Clock reference oscillators must provide a highly stable output frequency versus the variation of the different electrical and environmental conditions such as and not limited to supply voltage, temperature, stress, humidity and aging. The trimming of such oscillator is imperative to achieve high performance.

The ever increasing complexity of electronic systems due to requirements of supporting multiple standards, increased functionality, higher data rates and memory in a smaller size and at a lower cost is pushing designers to increase the integration level through the development of Systems on Chip (SoC) in deep submicron Complimentary MOS (CMOS) technologies to benefit from the increased gate density. Every application requires a reference clock where the oscillator frequency must not vary due to changes in supply voltage and temperature by more than a specific amount.

Quartz crystal oscillators (XOs) are the industry standard for generating a reference clock. The mature and stable technology of quartz crystals permits excellent control on the manufacturing process to select an exact cut angle to produce superior performance. Crystal oscillators stemming from the very high quality factor (Q) of the quartz crystal can achieve high frequency accuracy, low frequency drift with temperature and low phase noise. Consequently, crystal oscillators dominated the commercial market for many decades. However, crystals have not managed to scale nor integrate thus limiting the size and cost reduction of the reference clock.

Recent efforts in using high-Q Micro-Electro-Mechanical Systems (MEMS) resonators and Film Bulk Acoustic Resonators (FBARs) have illustrated possibilities of integrating a high-Q element and Application Specific Integrated Circuits (ASIC) in the same package. The cost of a MEMS resonator is lower than a quartz one owing to the very high number of resonators on a single MEMS wafer. Expensive ceramic packaging of crystal oscillators is also reduced to low cost plastic packaging. However, the assembly cost of a MEMS-based solution requires stacking of the wafer level packaged MEMS die and the CMOS die. Additionally, elaborate production testing is required to trim each part to the required performance over the specified temperature range. This process may require more than one temperature insertion to estimate the temperature compensation parameters and to adjust the oscillator frequency to the required value. This makes the testing cost of MEMS and FBAR oscillators too high to compete with XOs for consumer applications.

Another approach is to produce reference clocks using RC oscillators. Due to the low quality factor of an RC oscillator the frequency accuracy is limited, but excellent power consumption and full integration can be achieved, making this solution suitable for applications like wireless sensors networks (WSN). However, the testing cost of RC oscillators like MEMS and FBAR oscillators is very high due the extensive trimming which usually requires more than one temperature insertion point.

An alternative technology uses an all silicon CMOS reference clock based on an on-chip LC-tank. Such solutions are by definition highly integrated and have short lead times due to their programmability compared to XOs. Moreover, they can provide frequency accuracy and phase noise performances comparable to XOs. However, the large temperature dependence of LC-tanks has been the main challenge in designing an LC-tank based reference which requires sophisticated compensation techniques to neutralize the frequency variation. To successfully achieve the required accuracy in compensation it is imperative not just to have an accurate temperature measurement but to also have precise knowledge of the oscillator frequency across temperature and its frequency tuning control(s).

One trimming routine starts by selecting a center frequency ($f_o$) at a first temperature using a capacitor bank. Then at a second temperature the algorithm couples one or more resistances to the resonator as a method of temperature compensation. After that at a next temperature, the algorithm determines whether the required calibration has occurred over the predetermined temperature range or not. In case of not achieving the required performance the previous steps have to be redone iteratively until the total temperature dependence of the oscillator is minimized over the predetermined temperature range while attaining the required output frequency. Consequently, more than one temperature insertion point is required to achieve acceptable performance thus increasing the complexity of product testing and consequently increasing the overall cost of the product.

An all silicon CMOS reference clock is described in U.S. Pat. No. 8,072,281. It uses an on-chip LC-tank designed to operate at a very specific low temperature-sensitivity phase operating point. Thus, the architecture is applicable to a Self-Compensated Oscillator (SCO) that is self-compensated across temperature.

BRIEF DESCRIPTION OF THE DRAWING FIGURES

The present invention may be understood from the following detailed description in conjunction with the appended drawing figures. In the drawing:

FIG. 5 is a diagram of another calibration system for determining temperature sensitivity.

FIG. 6(A) is a diagram illustrating in circuit form how a phase shift calibration value may be determined.

FIG. 6(B) is a diagram illustrating operation of the circuit of FIG. 6(A).

FIG. 7(A) is a diagram illustrating in circuit form a different way of determining a phase shift calibration value.

FIG. 7(B) is a diagram illustrating operation of the circuit of FIG. 7(A).

FIG. 8 is a diagram illustrating in circuit form how a frequency setting calibration value may be determined.

DETAILED DESCRIPTION

Summary

A self compensated oscillator architecture utilizes phase shift circuitry to achieve minimum frequency deviation across temperature. It provides an electrical phase shift that is accurate, temperature independent and programmable through a digital phase setting (PS) word. The SCO requires trimming to get an optimum operating phase setting ($PS_{opt}$) in the predetermined temperature range and to adjust the oscillator output frequency to a target frequency by setting the oscillator's frequency setting (FS).

In one embodiment, an SPT algorithm is provided for the SCO, thus reducing the testing cost while achieving high frequency stability. The present apparatus is capable of finding the optimum phase operating point and of adjusting the oscillator frequency to the required value simultaneously. Thus it provides a robust, fast and low cost trimming solution for SCO thus decreasing the complexity of product testing and consequently decreasing the overall cost of the product.

Description

Figure 1B:
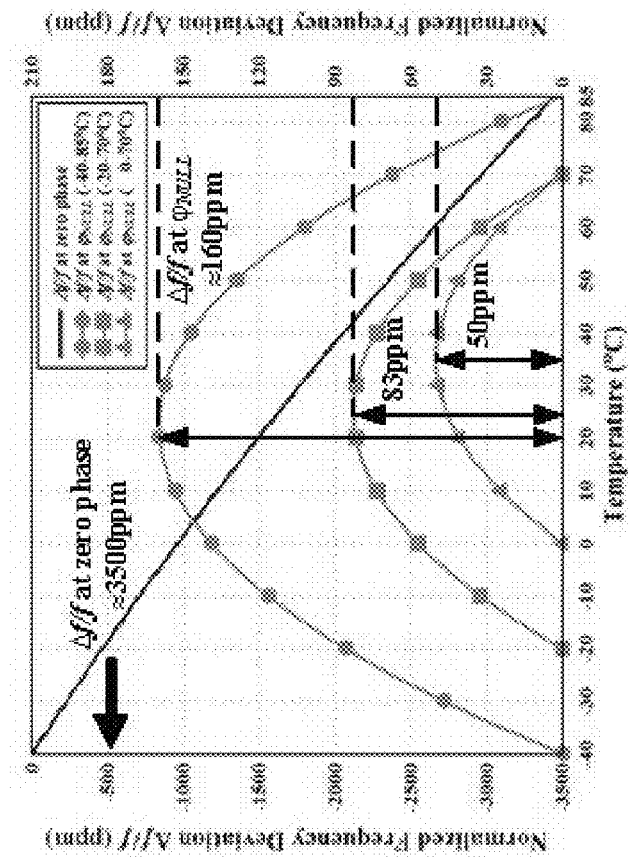
FIG. 1(B) is a plot of frequency variation over temperature when operating at the temperature null, for different temperature ranges.
Figure 1A:
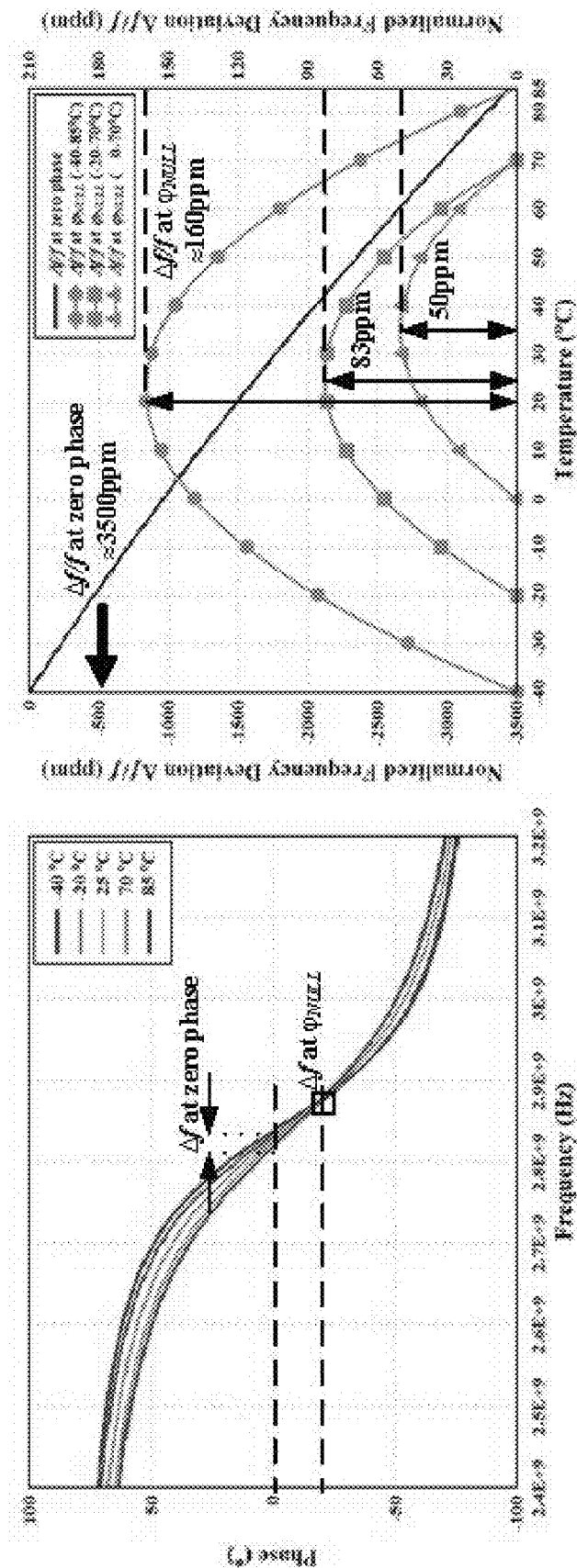
FIG. 1(A) is plot illustrating the concept of a temperature null and corresponding phase.

An LC oscillator is composed of an LC-Tank and an amplifier which is responsible for overcoming the tank losses. For the oscillator to have sustained oscillations the Barkhausen criterion requires an open loop gain greater than unity and phase equal to zero. Assuming that the used amplifier contributes a zero phase thus, at oscillation conditions, the LC-Tank impedance $Z_{Tank}$ will have a zero phase. FIG. 1(B) shows $Z_{Tank}$ phase versus frequency at different temperatures; a zero phase intersection with the tank phase curves over temperature (0° C.-70° C.) results in a large frequency variation $\Delta f_1$. As seen in FIG. 1(A), the tank phase curves across temperature intersect at a negative phase where frequency variation across temperature is minimized (frequency variation $\Delta f_{NULL}$).

Figure 2:
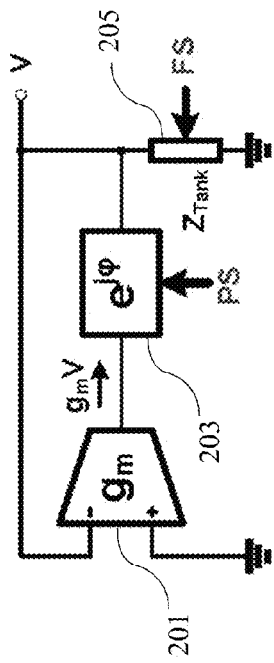
FIG. 2 is a diagram of a temperature-compensated LC oscillator.

The conditions at which minimum temperature sensitivity of frequency occurs is termed the LC-tank temperature null ($T_{NULL}$) and the phase across the tank is referred to as $\phi_{NULL}$. As shown in FIG. 2, the oscillator may be formed of a transconductor stage 201 and a phase shift stage 203. Phase magnitude is controlled via a digital phase setting (PS) word with very fine steps, while the oscillator frequency is tuned by changing the effective capacitance value of the tank impedance ($Z_{Tank}$) 205 using a frequency setting (FS) word with very fine steps. At steady state, the transconductor and phase shifter provide a phase that is the negative of the required $T_{NULL}$ phase. Thus, the LC-tank is forced to oscillate at the required non-zero $\phi_{NULL}$. One of the most important design aspects of the phase shift circuitry is to provide a phase that is accurate and temperature independent, otherwise frequency deviation will increase.

The SCO relies on operating at $\phi_{NULL}$ to achieve a high frequency stability across a specific temperature range. However, the value of $\phi_{NULL}$ will vary with process, oscillation frequency and the required operating temperature range. Thus, trimming is required to compensate for these variations. Trimming is one of the main challenges in having a highly accurate and fully-integrated LC-based reference oscillator as it can limit the overall cost and accuracy of the oscillator. The main objective of the trimming of the SCO is to set the oscillator's phase to $\phi_{NULL}$ and at the same time adjust the oscillator's frequency to the required output frequency.

There are many challenges to develop an accurate, robust and cost effective trimming solution for SCO. The first challenge is that a direct method for measuring the tank phase across temperature to determine directly the value of $\phi_{NULL}$ does not exist. Consequently, the brute force solution to find $\phi_{NULL}$ is to measure the oscillator's frequency while varying PS at the two extreme temperature points of the required operating range. The tank PS that minimizes the absolute frequency difference between the two extreme temperature points is considered the global $\phi_{NULL}$. However, this two temperature point trimming solution is not cost effective due to the high cost of the two required temperature insertions. Additionally, a very long testing time is usually required for a large number of accurate frequency measurements. The second challenge is that $\phi_{NULL}$ slightly changes as the oscillator's frequency changes. Moreover, the oscillator's frequency depends on the tank PS word. Thus, this coupled relation between the oscillator's frequency and the oscillator's temperature dependence imposes multiple trimming iterations to find $\phi_{NULL}$ and to adjust the oscillator's frequency to the required value simultaneously.

The following robust on-chip SPT algorithm overcomes these two challenges and enables achieving a highly accurate and cost effective SCO reference oscillator. Trimming is required to set $PS_{opt}$ so that the oscillator operates at $\phi_{NULL}$ with minimum frequency deviation across temperature, and at the same time adjusts the oscillator frequency to the required frequency by setting the oscillator's FS. The trimmed value of PS and FS are digitally stored on a non-volatile memory for future retrieval such as a One-Time Programmable (OTP) Read Only Memory (ROM) on chip after trimming.

SCO Temperature Sensitivity ($K_T$) Detection

Figure 3:
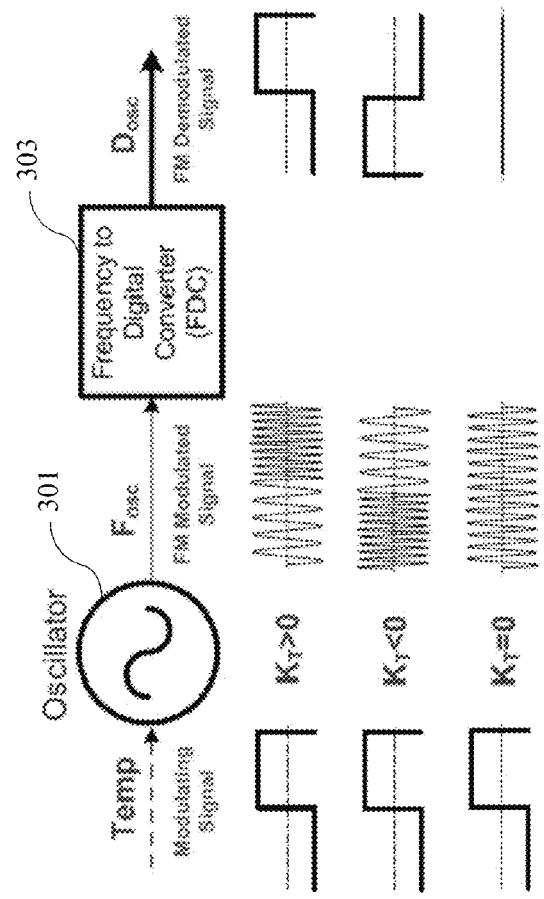
FIG. 3 is a diagram illustrating temperature modulation for purposes of determining temperature sensitivity of oscillation frequency.

Conceptually, the temperature dependence of any oscillator can be estimated at $T_o$ by applying a square wave temperature modulating signal as shown in FIG. 3. The output of an oscillator 301 in response to the temperature modulating signal will be a frequency modulated (FM) signal that depends on the frequency versus temperature dependence slope ($K_T$) at this temperature. The oscillator frequency ($F_{osc}$) can then be converted into a digital word ($D_{osc}$) using an accurate frequency-to-digital converter (FDC) 303 that performs FM demodulation to the oscillator output. The value of $K_T$ at $T_o$ can be estimated from the frequency difference $F_{osc}(T_o+\Delta T/2)-F_{osc}(T_o-\Delta T/2)$ where $\Delta T$ represents a variation in temperature around $T_o$. Equivalently, the difference between $D_{osc}(T_o+\Delta T/2)$ and $D_{osc}(T_o-\Delta T/2)$ can be utilized to generate the same estimate.

The difference between these two digital words gives an accurate digital representation of $K_T$ that is utilized in the present SPT trimming algorithm. The concept is illustrated in FIG. 3 where $K_T$ of the SCO is estimated using a temperature modulating signal and an FDC. At $\phi_{NULL}$, the SCO temperature dependence can be parabolic-like and $T_o$ is the center of the required temperature range as illustrated previously in FIG. 1(B). Thus at $T_o$, if $K_T=0$ would imply a minimum SCO oscillation frequency temperature variation across a specific temperature range.

Different methods of temperature modulation of oscillators may be used to determine their temperature sensitivity $K_T$ for single insertion temperature point trimming. In one embodiment, on-chip heaters are used to generate different temperature modulation waveforms. The temperature modulation waveform can be any shape including sinusoidal, triangular, saw tooth or square waveform. The example demonstrates a square or an ON/OFF modulating waveform. This approach can be easily extended to trim other reference oscillators including TCXO, MEMS, FBAR, and RC oscillators.

Figure 4:
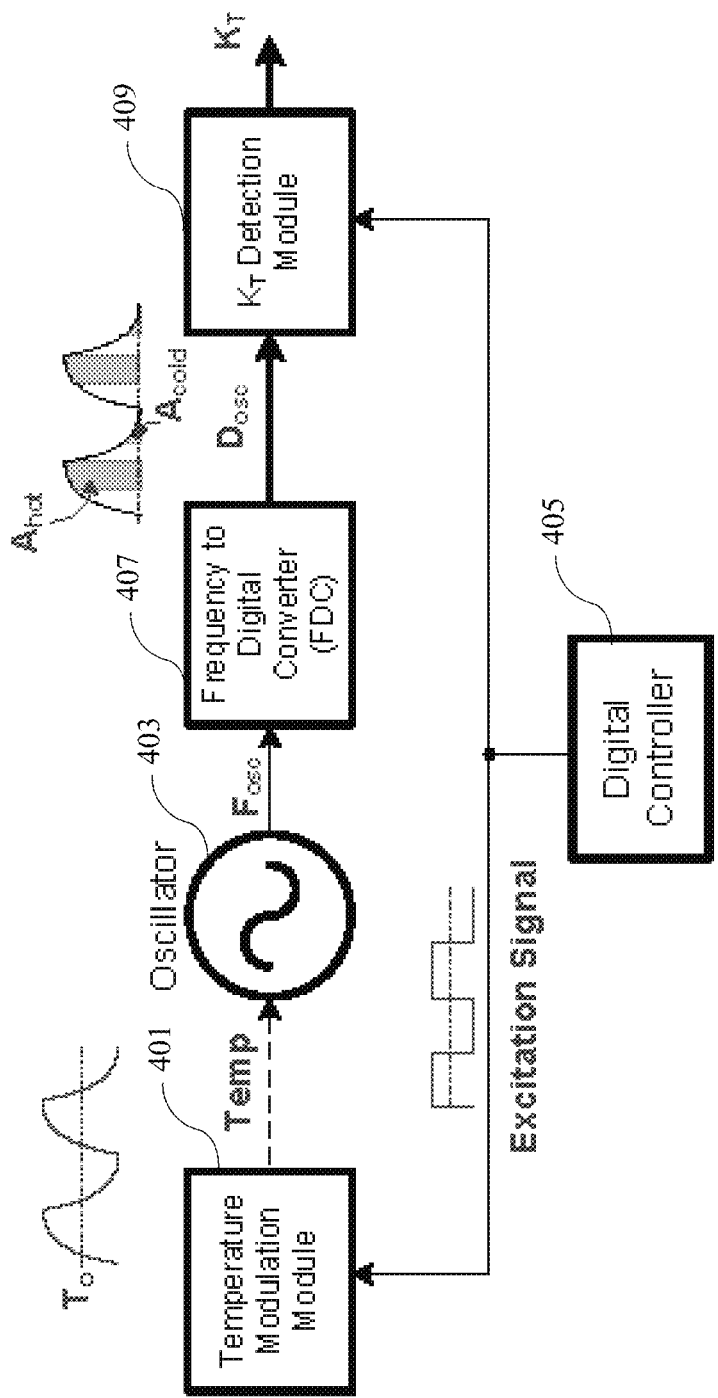
FIG. 4 is a diagram of a calibration system for determining temperature sensitivity.

The architecture may employ a simple ON/OFF temperature modulation, thus simplifying the temperature modulation module. Practically, the thermal modulation frequency is limited by the thermal time constant of the packaged part under test. Thus, the temperature modulating square wave is low pass filtered as illustrated in FIG. 4. A temperature modulation module 401 applies temperature modulation to an oscillator 403 under control of a digital controller 405. An output signal of the oscillator is applied to an FDC 407. A temperature sensitivity detection module 409 uses an output signal of the FDC 407 and an excitation signal from the digital controller 405 to determine $K_T$.

The thermal time constant depends on many factors mainly die size and package size. As the thermal modulation frequency decreases, the trimming routine becomes slower. Thus, testing cost increases, impacting the overall cost of SCO. Consequently, it becomes very important to reach $PS_{opt}$ that is equivalent to $\phi_{NULL}$ in a minimum number of thermal modulation cycles. Oscillator's thermal and flicker phase noise affect the accuracy of the SPT especially when $K_T$ approaches zero as the magnitude of the demodulated signal becomes very close to zero too.

The impact of phase noise at very low frequency offsets on $K_T$ is insignificant as sensing $K_T$ depends on the difference between two frequencies. Thus, most of the noise will be cancelled. However, phase noise at high frequency offsets is effective and can be suppressed by incorporating an integrate and dump filter. Only half of the heating and cooling periods are utilized by the integrate and dump filter due to the low pass filter effect induced by the slow thermal time constant of the package under test. A set percentage of the heating cycle period is integrated into $A_{hot}$ while a similar percentage of the cooling cycle period is integrated into $A_{cold}$ as shown in FIG. 4. The difference between $A_{hot}$ and $A_{cold}$ is thus a digital word that represents $K_T$ more accurately in the presence of oscillator phase noise and a large thermal time constant. In this manner, only phase noise at frequency offsets close to the modulation frequency can slightly affect the accuracy of $K_T$ sensing and consequently the results of SPT.

Another method for finding the $K_T$ of any oscillator at $T_o$ is illustrated in FIG. 5. As compared to FIG. 4, a triangular excitation signal is used to obtain a triangular temperature modulation characteristic. A temperature excitation signal superimposed over $T_o$ is applied to the oscillator through a temperature modulation module. The oscillator frequency will act in response to the temperature modulation signal according to its characteristic $K_T$. The FDC will convert the oscillator frequency into a digital word ($D_{osc}$). If the excitation signal is a triangular wave, then $\Delta f/\Delta T$ can be obtained using a difference block 501. During the negative slope of the triangular wave $\Delta T$ is negative so the output of the difference block 501 is multiplied by the slope sign of the triangular wave using a multiplier 503 to finally obtain a digital word that accurately represents $K_T$ at $T_o$. The difference block 501 helps to filter out the close-in phase noise of the oscillator while an Integrate & Dump filter 505 is used to suppress high frequency noise. Consequently, $K_T$ can be measured more accurately. This triangular wave modulation enables using a higher thermal modulation frequency over a square wave modulation technique, consequently a faster trimming routine. (The structure 550 is reused as structure 2150 in FIG. 21, described below.) The challenge in this method is to accurately modulate the temperature using a triangular wave; such a requirement may be taken into account in design of the temperature modulation module.

SCO Phase Trimming Algorithm

An objective of the phase trimming algorithm is to search for $PS_{opt}$ that adjusts the SCO $K_T$ to a user's slope control word (KCW). The selection of KCW depends on the operating $T_o$, the predetermined temperature range and the desired SCO temperature dependence curve. Usually a value of KCW that is equal to zero or very close to zero is used to optimize the SCO temperature dependence using room temperature only (RTO) trimming ($T_o=25°$ C.) for the different temperature ranges illustrated in FIG. 1(B). Running the trimming routine at room temperature is highly valuable as it reduces the overall testing and trimming cost of the product.

One method to find $PS_{opt}$ is to sweep PS and measure its corresponding $K_T$ to select $PS_{opt}$ which gives $K_T$=KCW. However, we may need $2^n$ modulation cycles to find $PS_{opt}$, where n is the number of bits of the PS word. Consequently, this method will consume a lot of time thus increase production testing time and cost. A successive approximation register (SAR) trimming algorithm is adopted to minimize the number of modulation cycles involved in the trimming to n modulation cycles. FIG. 6(A) illustrates a block diagram of the present SAR trimming algorithm. The binary search process is illustrated in FIG. 6(B). The algorithm starts by loading an initial phase setting ($PS_{initial}$) into an initial, output accumulator 601 and loading an initial step into a SAR 603. Usually $PS_{initial}$ is set to middle of phase setting PS range, but the setting can be chosen to reduce the convergence time. Temperature sensitivity $K_T$, previously determined, is subtracted from a control word KCW by a block 602, and the result is applied to a sign detection, circuit 605. Second, after one modulation cycle the sign of $K_T$ is detected by the block 605 and inverted then multiplied by the SAR step using a multiplier 607. The output of the multiplication is then added to $PS_{initial}$ to produce $PS_{next}$. The operation of the algorithm requires n cycles to reach $PS_{opt}$, where the SAR step is halved after each cycle to complete the binary search.

Slope control word KCW is an input parameter to the trimming algorithm specifying a specific slope criterion to search for, and the trimming algorithm starts searching this criterion just by changing the PS of the oscillator. The relation between $PS_{opt}$ and KCW is a result of the algorithm, which assumes that there is a single PS that satisfies $PS_{opt}$ where the behavior of the oscillator is a specific shape with a specific slope around $T_o$ defined by KCW. The design of the oscillator may be such that at $PS_{opt}$, the behavior of the oscillator has a specific shape, for example a parabola or an inverted sine. Based on the knowledge of the shape, the trimming algorithm starts searching for $PS_{opt}$ by means of the slope of the expected shape around $T_o$. For instance, if the expected shape is a parabola, the trimming algorithm searches for a KCW=0 around $T_o$. If the expected shape is an inverted sine, the trimming algorithm searches for a KCW>0 around $T_o$.

The SAR algorithm saves a lot of time compared to extensive sweep techniques, but it depends only on the sign of $K_T$ and ignores its magnitude. The magnitude may be very helpful to minimize the number of cycles of the algorithm. FIG. 7(A) illustrates a block diagram of a least mean square (LMS) trimming algorithm that utilizes both the sign and magnitude of $K_T$ to reach $PS_{opt}$ faster than the SAR algorithm. Similar to the SAR algorithm, the LMS algorithm starts by loading $PS_{initial}$ into the output accumulator 701. Temperature sensitivity $K_T$, previously determined, is subtracted from a control word KCW by a block 702, and the result is applied to a multiplier circuit 707. After each modulation cycle $K_T$ is detected and inverted then multiplied by an LMS gain factor (multiplier 707). The LMS gain factor may be constant or variable. Its defines the convergence speed, the steady state error and the stability of the loop. When a large step size is used, the adaptation process converges faster, but it would have a greater steady state error and lower phase margin. After each modulation cycle, the value of PS gets closer to $PS_{opt}$ and the magnitude of $K_T$ gets closer to KCW. The operation of the algorithm is finished when the magnitude of $K_T$ is smaller than a certain value defined by the user or after certain number of cycles defined by the user.

SCO Frequency Trimming

Different methods and apparatus may be used to trim the FS of the oscillator to adjust its output frequency as discussed. FIG. 8 shows a generic block diagram of a digital phase locked loop (DPLL) and a digital frequency locked loop (DFLL) depending on the type of the loop filter. An FDC 801 will convert the oscillator frequency into $D_{osc}$. The FDC uses an external reference clock whose frequency is equal to $F_{ref}$. The reference clock is assumed accurate and it is frequency stable during trimming as the oscillator output frequency will be referenced to it. The FDC output ($D_{osc}$) is subtracted from the user frequency control word (FCW) at block 803 to give a digital word that represents the frequency error ($f_e$) between the oscillator frequency ($F_{osc}$) and the target required frequency (FCW·$F_{ref}$). The output of the subtraction $f_e$ is filtered via a digital loop filter 805 to control FS of the oscillator 807. The accumulator of the digital loop filter may be loaded with an initial frequency setting ($FS_{Init}$) to speed-up the frequency settling. The loop will settle when the oscillator's frequency is equal to the target required frequency ($F_{osc}$=FCW·$F_{ref}$) at steady-state. Note if the digital loop filter is only an accumulator then the DPLL loop will turn into a DFLL. The settling time of the DPLL can be faster than a DFLL, but the advantage of a DFLL is being unconditionally stable.

SCO Simultaneous Phase and Frequency Trimming

As has been explained previously, the coupled relation between the oscillator's frequency and oscillator's optimum phase has represented a major challenge for the trimming of the integrated oscillators and has required multiple trimming iterations. Phase trimming is much slower than frequency trimming as it is limited by the slow thermal time constant of the packaged part under test.

Figure 9:
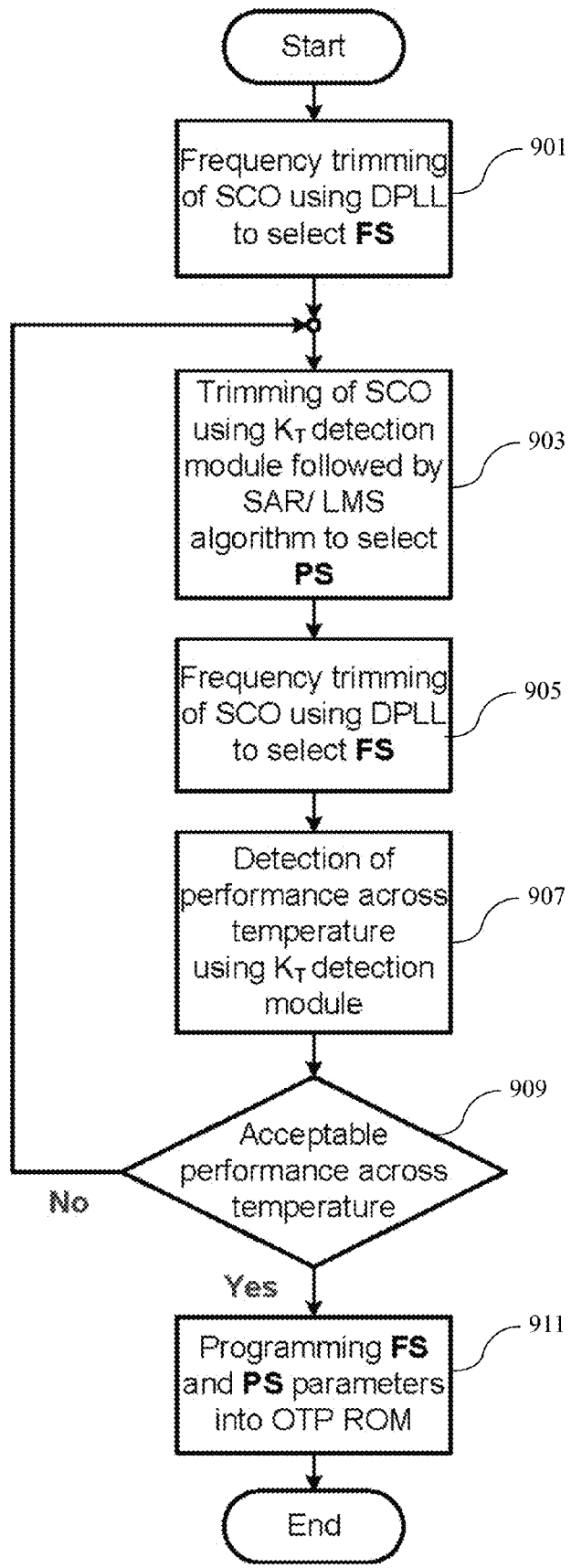
FIG. 9 is a flow chart of a calibration process.

FIG. 9 illustrates a flowchart of an iterative trimming routine for the SCO. At block 901, the iterative trimming routine is started by frequency trimming of the SCO by selecting a certain FCW that defines the oscillator frequency locked in DPLL as ($F_{osc}$=FCW·$f_{ref}$). The second step (903) is the single temperature point trimming of the SCO by selecting a certain KCW using a $K_T$ detection module followed by SAR or LMS trimming algorithm to search for $PS_{opt}$. During this process, the DPLL is disabled where the oscillator is not locked anymore and the FDC is used now within the $K_T$ detection module. After several temperature modulation cycles, the SAR or LMS algorithm selects $PS_{opt}$. However, changing the value of PS will change the output frequency of the oscillator besides changing its temperature performance. This means that the value of FS of the oscillator needs to be readjusted again using the DPLL (905).

Finally, the oscillator's performance across temperature is checked using the $K_T$ detection module (907). If the performance is acceptable (909) both FS and PS parameters are programmed in the OTP ROM (911). However, the oscillator performance across temperature may be deteriorated after the second frequency trimming step. This happens because the optimum phase operating point $\phi_{NULL}$ is changed when FS is changed. Consequently, the single temperature point trimming of the SCO has to be repeated again. In conclusion, this conventional trimming routine, even though it employs a single temperature insertion point, requires several iterations and thus increases the production testing time and accordingly increases the overall product cost.

Figure 10:
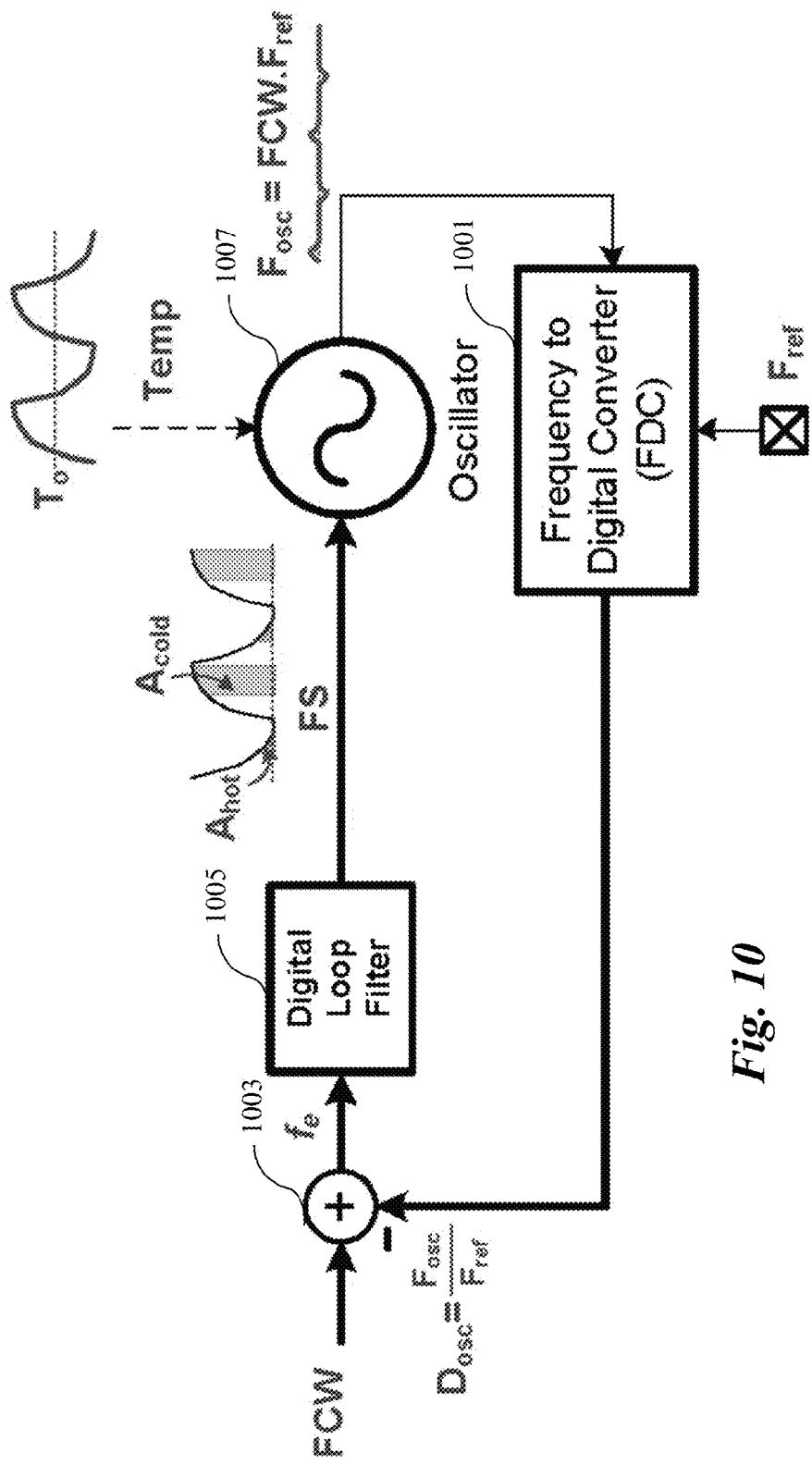
FIG. 10 is a diagram illustrating in circuit form a different way of determining a frequency setting calibration.

In order to minimize the testing time, it is necessary to eliminate multiple phase trimming iterations. The techniques described herein overcome the disadvantages of the iterative trimming routine and performs simultaneous trimming of the oscillator temperature sensitivity and output frequency by controlling both PS and FS at the same time. The DPLL is used to adjust its output frequency to the required frequency. The DPLL will force the oscillator frequency to be FCW·$f_{ref}$, now the oscillator is locked to that frequency and not free running anymore. A simple ON/OFF temperature modulation is applied to the oscillator. The frequency of the temperature modulation is too low because of the large thermal time constant and it is much smaller than the bandwidth of the DPLL. Consequently, the loop will track the slow changes due to temperature so that the oscillator frequency remains constant while the oscillator FS will invert any low frequency temperature modulation. In this way, the DPLL performs the required frequency demodulation process instead of the FDC while preserving the oscillator frequency to the required frequency. Modified operation of the circuitry of FIG. 8 is illustrated in FIG. 10.

The FS will be used as an input to the $K_T$ detection module. The second half the heating period is integrated into $A_{hot}$ while the second half the cooling period is integrated into $A_{cold}$ as shown in FIG. 10. Then the difference between $A_{hot}$ and $A_{cold}$ is a digital word that accurately represents $K_T$. At the end of each modulation cycle (heating then cooling) the output of the $K_T$ detection module is used in the SAR/LMS trimming algorithm to find the new PS. As has been mentioned before, changing PS will change the oscillator frequency. However, the DPLL will rapidly lock to the required target frequency FCW·$f_{ref}$ in a period much smaller than half the heating period. Moreover, the settling of the DPLL does not affect the operation of $K_T$ detection module because it starts integration in the second half of the heating period where the ADPLL is settled and it depends on the difference between $A_{hot}$ and $A_{cold}$ rather than their absolute value. Now both loops are working at the same time to search for the $PS_{opt}$ at the required frequency FCW·$f_{ref}$, thus canceling the need for several iterations required in the conventional trimming routine.

Figure 11:
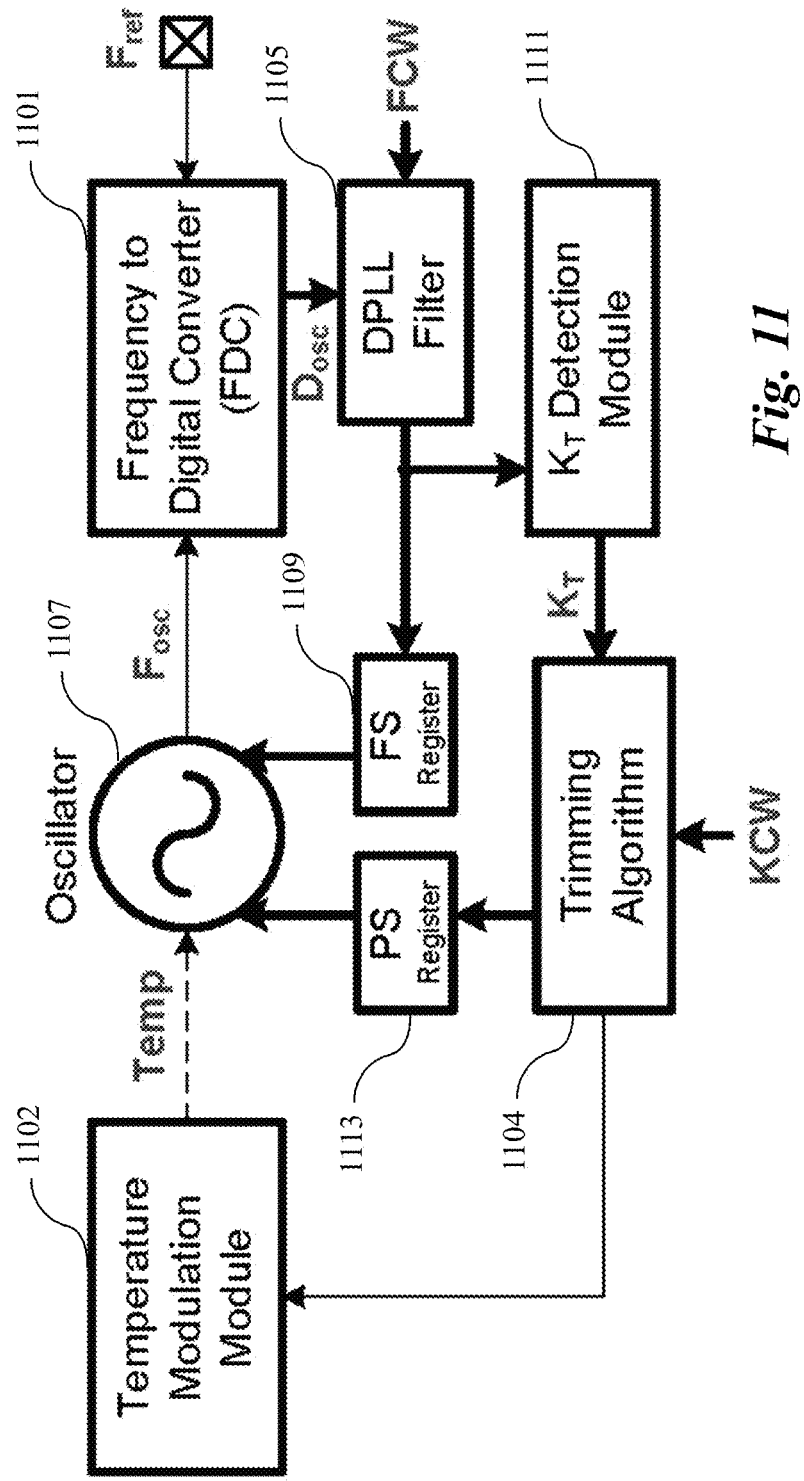
FIG. 11 is a diagram of a calibration system for determining both phase shift and frequency setting calibration values.

FIG. 11 shows the top-level diagram of the SPT with simultaneous phase and frequency trimming. The digital Implementation of the SPT module is highly programmable to accommodate different oscillators with different characteristics. A serial input/output (I/O) interface is used to communicate with the chip to set different programmable parameters. It utilizes a single insertion temperature point and employs on-chip heaters in the temperature modulation module to measure the oscillator temperature sensitivity $K_T$.

Moreover, it utilizes smart algorithms including SAR and LMS algorithms rather than extensive sweeps to provide a fast, robust and low cost trimming algorithm. At the end of the trimming routine, the oscillator trimmed parameters PS and FS are programmed in a OTP ROM module. The OTP ROM is used to hold the value of these parameters in normal operation after trimming is done.

In FIG. 11, a temperature modulation module 1102 applied temperature modulation to an oscillator 1107 under control of a trimming algorithm 1104 having as an input KCW. An output frequency of the oscillator 1107 is detected using a frequency-to-digital converter 1101 having as an input a reference frequency $F_{ref}$. The detected frequency is filtered by a DPLL filter 1105. An output of the DPLL is input to an FS register 1109, the value of which is applied to the oscillator 1107. The output of the DPLL is also output to a $K_T$ detection module 1111, which detect the value of $K_T$ and applies it to the trimming algorithm 1104. The trimming algorithm determines a value of PS and stores it in a PS register 1113, the value of which is applied to the oscillator 1107.

The PS register is used to hold the value of the phase setting factor of the SCO or the temperature compensation parameter in any other oscillator. PS is adjusted to obtain an oscillator with minimum frequency variation with temperature. The FS register is used to hold the value of the frequency setting of the oscillator and is used to tune the oscillator to the required frequency.

However, the use of the DPLL as a frequency demodulator may not be suitable for some oscillators where the relation between FS and output frequency suffers from high non-linearity. This may be the case when the capacitor bank of the oscillator is split into a coarse/fine capacitor bank with overlapping ranges. For such oscillators, the simultaneous operation of the DPLL and phase trimming algorithm may not converge do to the non-linearity of FS.

SCO Interleaved Phase and Frequency Trimming

Figure 12:
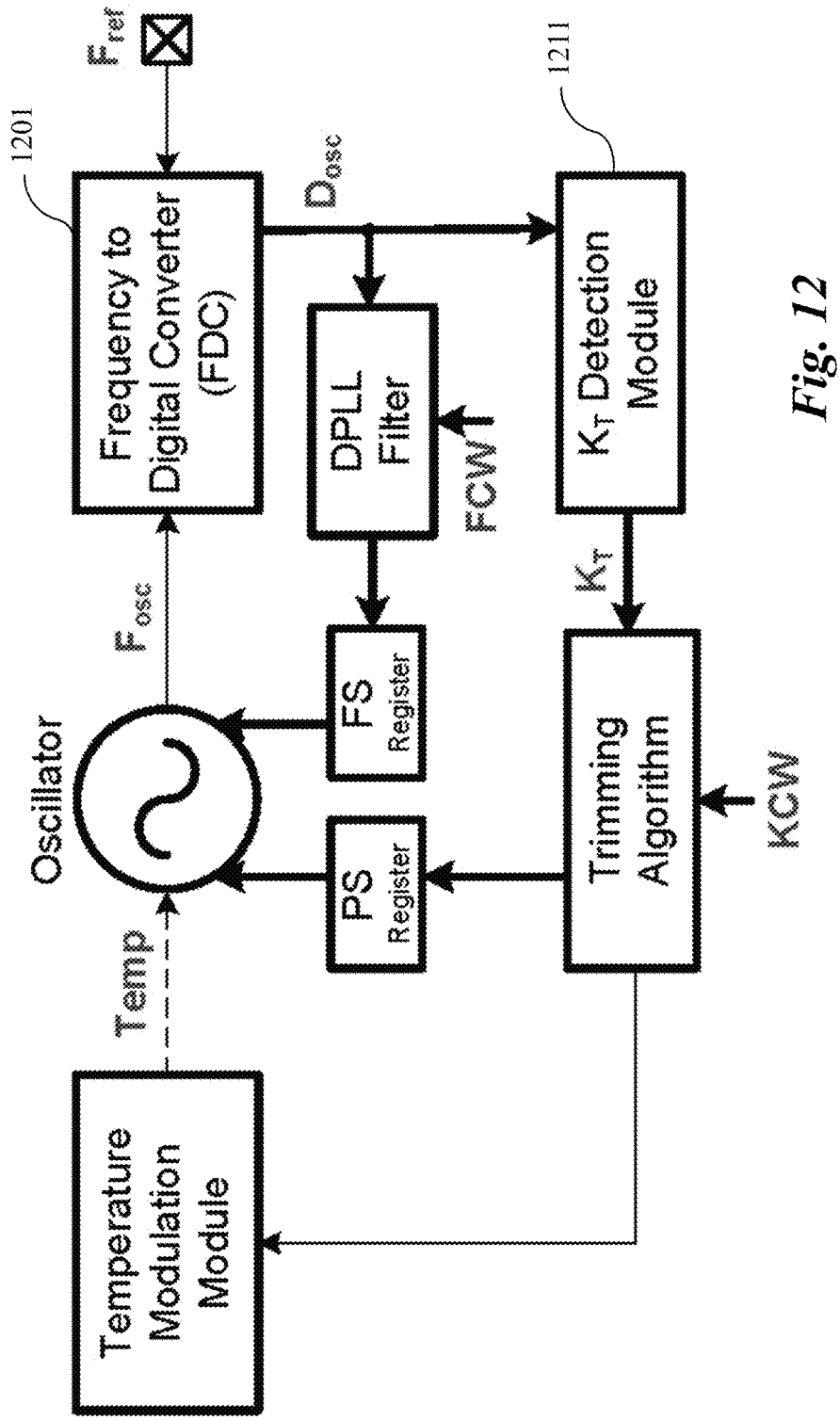
FIG. 12 is a diagram of another calibration system for determining both phase shift and frequency setting calibration values.

In the case just mentioned, a slightly different approach may be followed. In this approach, the FDC will be used again as a frequency demodulator and its output will be the input of the $K_T$ detection module as shown in FIG. 12. FIG. 12 differs from FIG. 11 in that in FIG. 12, the $K_T$ detection module receives an output of the FDC 1201 directly, while the oscillator is not locked. As has been mentioned before, PS is changed after each temperature modulation cycle. The DPLL will be enabled for half the heating period of the modulation cycle and is started to reacquire the required frequency FCW·$f_{ref}$. Afterwards, the DPLL is disabled and the oscillator becomes free-running again to respond to the temperature modulation as the $K_T$ detection module is insensitive to the absolute frequency of the oscillator. The time-interleaving operation of the two trimming loops allows searching for $PS_{opt}$ at the required frequency FCW·$f_{ref}$, thus it eliminates the imperative iterations of the conventional trimming routine and overcomes the non-linearity of the frequency tuning of digitally controlled oscillators.

The techniques described herein provide a smart, robust, and all-digital trimming solution for SCO thus decreasing the complexity of production testing and consequently decreasing the overall cost of the product.

Temperature Modulation Module Implementations

Figure 13B:
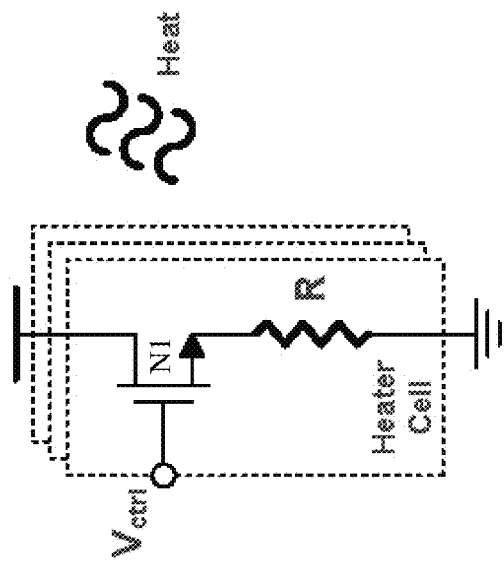
FIG. 13(B) is a diagram of another heater element.
Figure 13A:
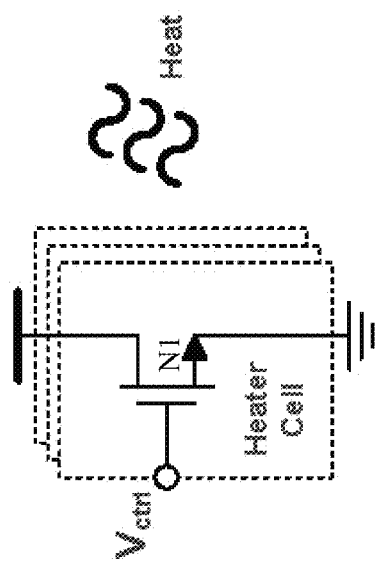
FIG. 13(A) is a diagram of a heater element.
Figure 14:
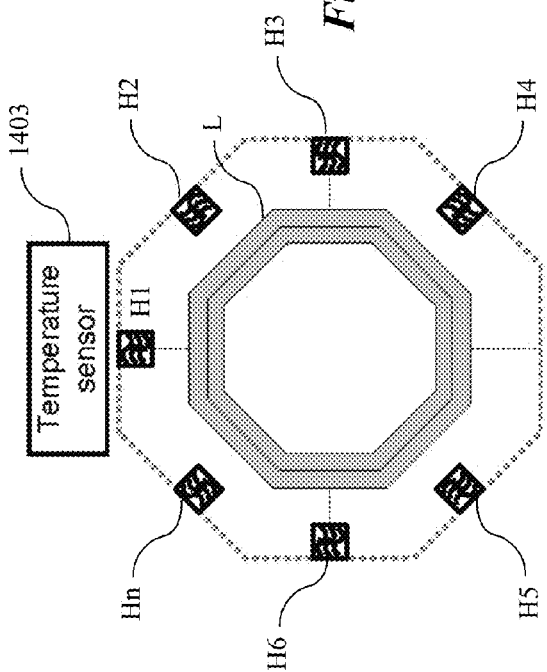
FIG. 14 is a diagram of oscillation, compensation and sensing circuitry.

Different methods and apparatus may be used to modulate the chip temperature using integrated techniques. FIG. 13(A) shows a circuit implementation of an on-chip heater cell using only an NMOS transistor N1. The amount of heat generated is controlled by analog voltage ($V_{ctrl}$). The implementation of FIG. 13(B) adds a resistance (R) in series with the NMOS transistor in order to limit the current. Many heater cells H1-Hn may be distributed around the oscillator, for example an inductor L, which is coupled to other oscillator circuitry 1401 as shown in FIG. 14. A temperature sensor 1403 is located in proximity. An objective of this configuration is to achieve a suitable temperature field across the oscillator. The generated heat will increase the temperature of the chip on average by ΔT, the magnitude of ΔT depends on many factors including but not limited to: number of heater cells, die area, package type and package volume. This configuration can be used to make ON/OFF temperature modulation by setting $V_{ctrl}$ to ground or supply voltage.

Figure 15:
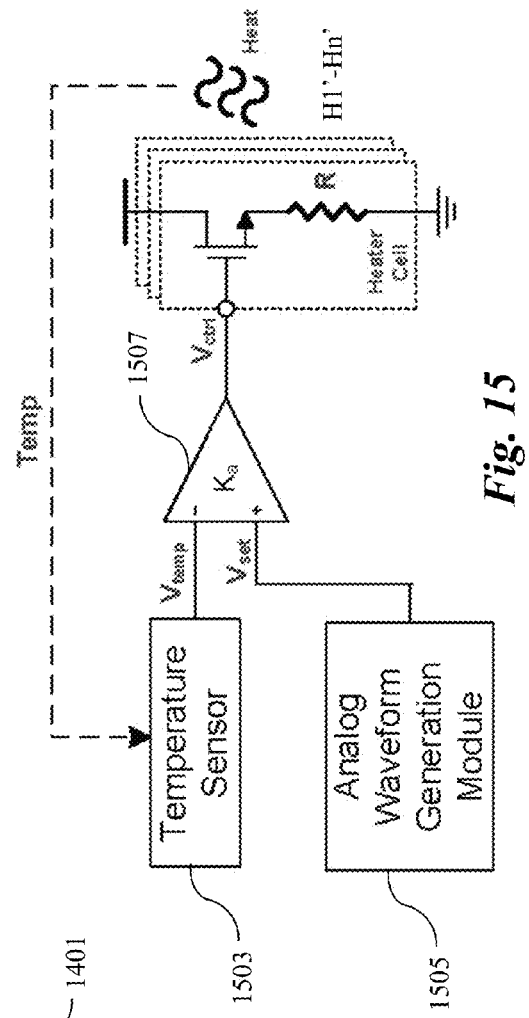
FIG. 15 is a diagram of temperature modulation circuitry.

FIG. 15 shows a block diagram of an analog temperature modulation in which the temperature modulation can be accurately controlled. It employs a temperature sensor 1503 to sense the chip temperature and convert it into an analog voltage ($V_{temp}$). The relationship between the chip temperature and $V_{temp}$ is linear. This voltage is subtracted from a user set voltage ($V_{set}$) from an Analog Waveform Generation Module (AWGM) 1505, then amplified using the error amplifier 1507 whose gain equals to ($K_a$). An output signal of the error amplifier 1507 is used to control heater cells H1'-Hn'. The negative feedback loop will force the heaters to generate the required amount of heat so that $V_{temp}$ equals to $V_{set}$. The loop stability is maintained due to the presence of the very low frequency dominant pole of the heaters. In this manner, the temperature of the chip may be controlled linearly and accurately using $V_{set}$. Different temperature modulation waveforms can be easily generated in the voltage domain using the AWGM.

Figure 16:
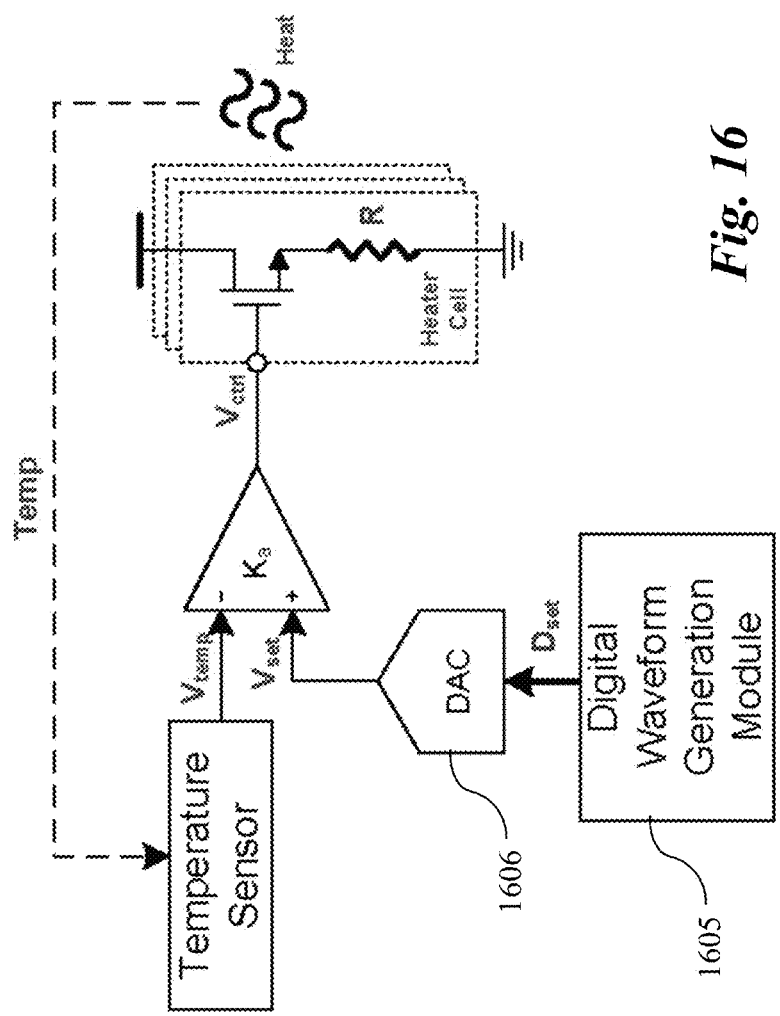
FIG. 16 is a diagram of another temperature modulation circuit.

In order to have precise control on the temperature modulation waveform, AWGM is replaced by a Digital Waveform Generation Module (DWGM) 1605 and a Digital to Analog Converter (DAC) 1606 as shown in FIG. 16. The implementation of the DWGM is much simpler than AWGM.

Figure 17:
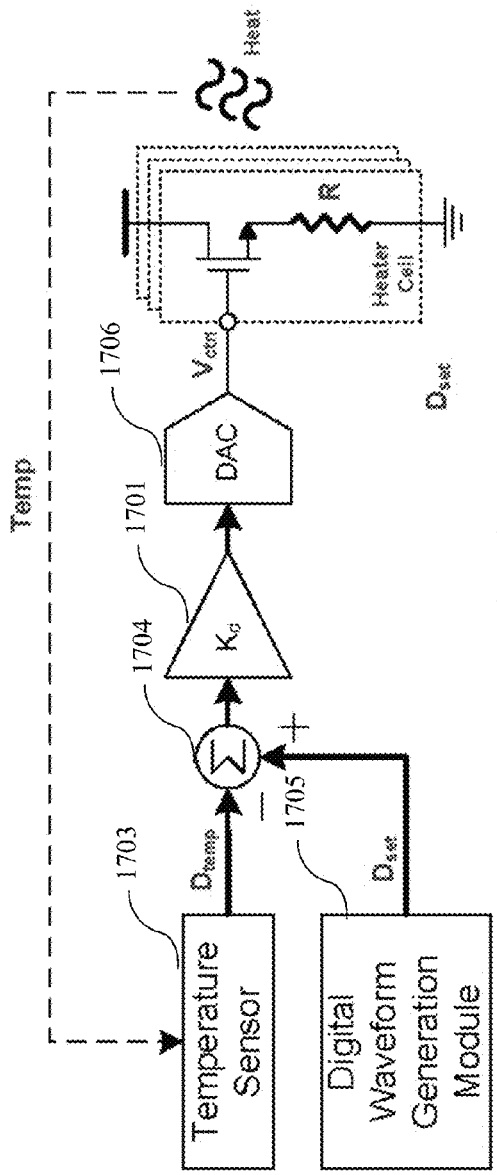
FIG. 17 is a diagram of still another temperature modulation circuit.

FIG. 17 shows a block diagram of a digital temperature modulation module. It employs a digital temperature sensor 1703 to sense the chip temperature and converts it into a digital word ($D_{temp}$). Similar to the analog temperature modulation module, $D_{temp}$ is subtracted (block 1704) from a user set digital word ($D_{set}$) generated by a Digital Waveform Generation 1705 then multiplied by gain equal to ($K_d$) using an amplifier 1701 to control the heaters though a DAC 1706.

Frequency to Digital Converter (FDC) Implementations

Figure 18:
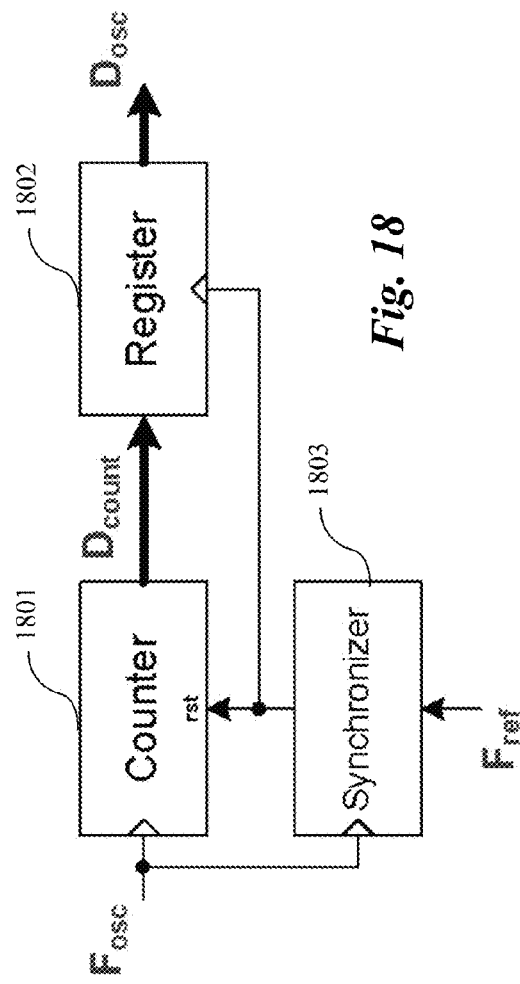
FIG. 18 is a diagram of a frequency-to-digital converter.

The function of the FDC is to measure the frequency of a clock and convert it into a digital word. The main specifications of the FDC are as follows:
 (1) Frequency Resolution ($f_{res}$)
 (2) Sampling Frequency ($f_s$)
 (3) Dynamic Range Different techniques may be used to design an FDC. FIG. 18 shows a block diagram of a counter based FDC. A counter 1801 is clocked with the oscillator frequency ($F_{osc}$) and it starts counting at the positive edge of the reference frequency ($F_{ref}$) after synchronization by synchronizer 1803. At the end of the reference period, the counter output is latched to a register 1802. This means that the counter based FDC is used to compute the integer ratio ($D_{osc}$) between $F_{osc}$ and $F_{ref}$. The sampling frequency as well as the frequency resolution of this architecture is equal to $F_{ref}$. This means that there is a trade-off between achieving a high sampling frequency and fine frequency resolution. The dynamic range is determined by the number of bits of the counter.

Figure 19:
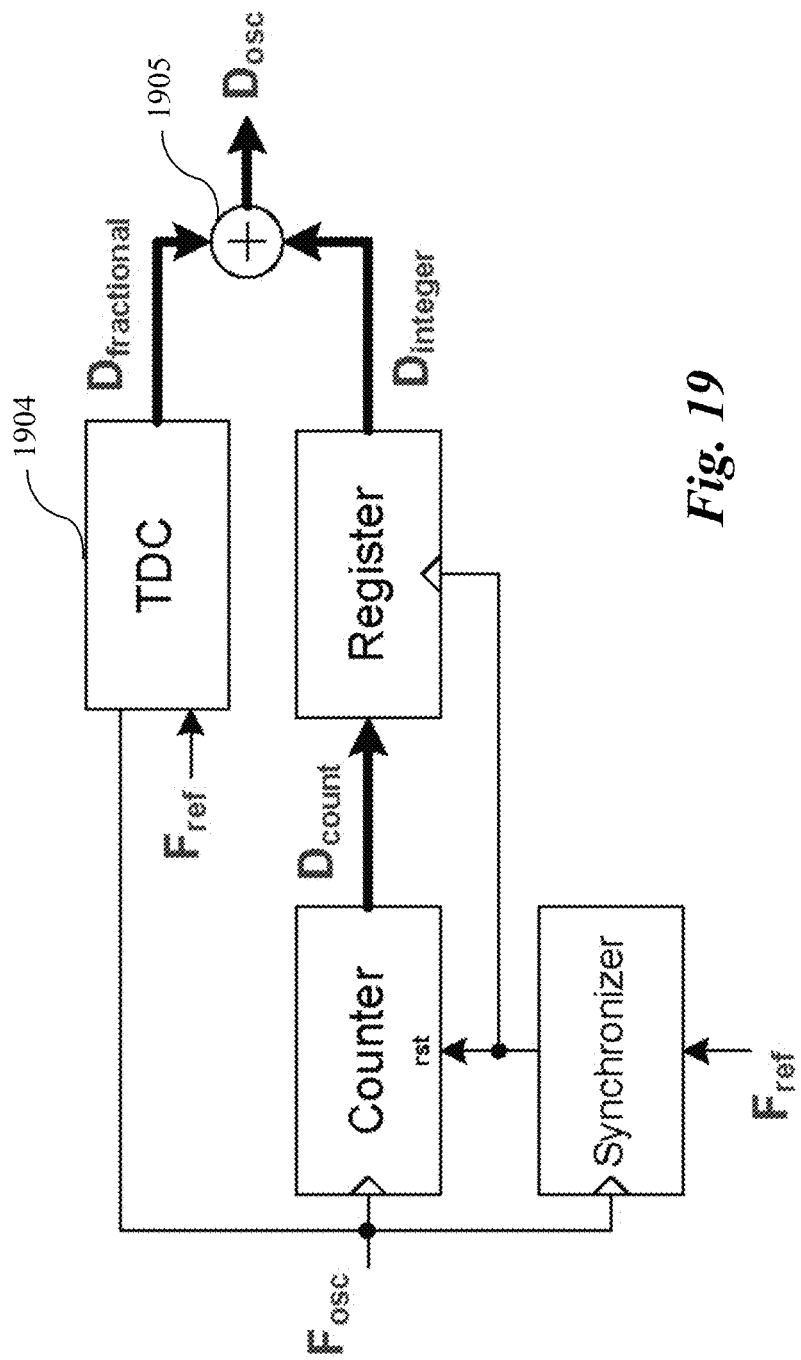
FIG. 19 is a diagram of another frequency-to-digital converter.

FIG. 19 shows a block diagram of a fractional FDC that breaks the trade-off between achieving a high sampling frequency and a fine frequency resolution. The number of whole $F_{osc}$ periods between two reference edges is computed as $D_{integer}$ using a counter as mentioned before. The residual time distance between the reference period and the $D_{integer}$ oscillator periods is measured using a time-to-digital converter (TDC) 1904 as $D_{fractional}$. Both integer and fractional parts are added (block 1905) to produce the digital output of the converter ($D_{osc}$). Here, the sampling frequency is equal to $F_{ref}$ while frequency resolution is determined by the resolution of the TDC.

Single Point Trimming for TCO

Figure 20:
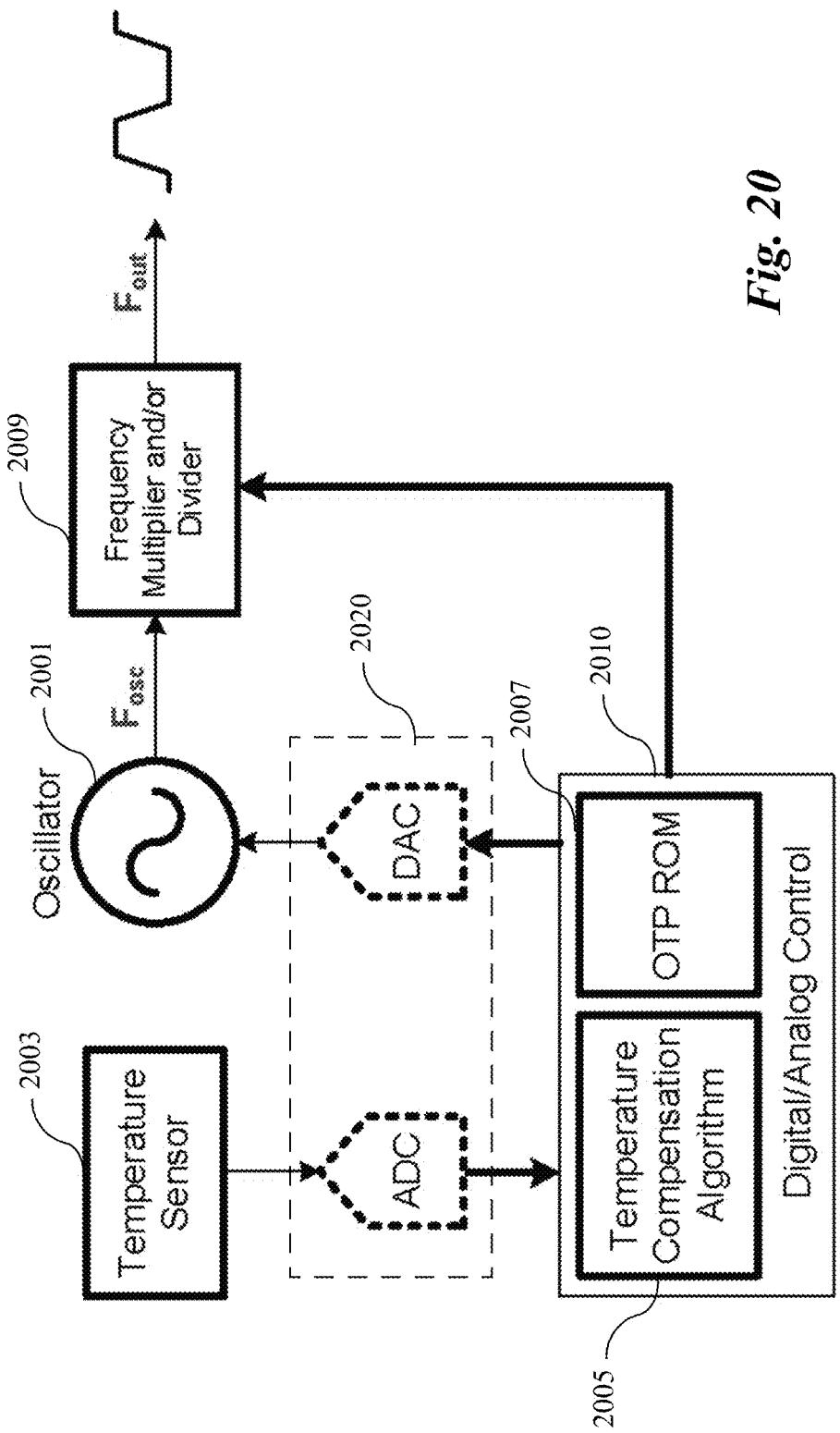
FIG. 20 is a diagram of a generalized temperature compensation system.

The techniques described can be reconfigured easily to provide a robust, low-cost and fast SPT routine for any temperature compensated oscillator (TCO) including TCXO, MEMS, FBAR, and RC oscillators. FIG. 20 illustrates a generic block diagram of an open loop TCO. An open loop temperature compensation technique aims to negate the temperature generated frequency shift of the oscillator 2001 by imposing a frequency shift in the opposite direction of equal magnitude using a temperature sensor 2003 and a digital/analog control module 2010. To achieve this, one can modify the oscillation frequency using one or more frequency tuning controls of the oscillator. Alternatively one can follow the oscillator with a frequency multiplier/divider 2009 and control the multiplication/division factor such that the output frequency is temperature independent. In the illustrated embodiment, the digital/analog control module includes a temperature compensation algorithm 2005 and an OTP ROM 2007. Conversion circuitry 2020 is provided as needed.

A smart compensation algorithm can cancel the temperature dependence of the oscillator by utilizing accurate temperature measurement and dynamic adjustment of the oscillator or frequency multiplier/divider based on a linear or higher-order polynomial fit. However, choosing the optimum coefficients of the polynomial fit is difficult and may require extensive characterization of the complete system to achieve tight temperature stability in the predetermined temperature range. This means that every single part has to be calibrated using multiple insertion temperature points to achieve the required specification. Consequently, the production cost increases dramatically thus increasing the cost of the whole product.

The techniques described herein provide an SPT algorithm for any TCO, thus reducing the testing cost while achieving high frequency stability. The present apparatus is capable of finding the optimum temperature compensation parameters and of adjusting the oscillator frequency to the required value simultaneously. Thus it provides a robust, fast and low cost trimming solution for TCO thus decreasing the complexity of product testing and consequently decreasing the overall cost of the product.

Assume an oscillator, to be temperature compensated, has temperature dependence as described in equation (1), where T is the operating temperature and $T_o$ is the center of a predetermined temperature range. $a_1$, $a_2$ and $a_3$ are constants representing the oscillator's temperature dependence. The aim of the temperature compensation algorithm is to negate this temperature dependence dynamically based on accurate temperature measurement ($D_{temp}$). The compensation algorithm tunes the oscillator and/or the frequency multiplier/divider according to a polynomial function whose coefficients are $c_1$, $c_2$ and $c_3$. The optimum values of the compensation coefficients ($c_1$, $c_2$ and $c_3$) are those which make the temperature dependence coefficients ($a_1$, $a_2$ and $a_3$) equal to zero.

$$F_{out}=F_o+a_1\times(T-T_o)+a_2\times(T-T_o)^2+a_3\times(T-T_o)^3 F_{out}+a_1\times(T-T_o)+a_2\times(T-T_o)^2+a_3\times(T-T_o)^3 \quad (1)$$

Figure 21:
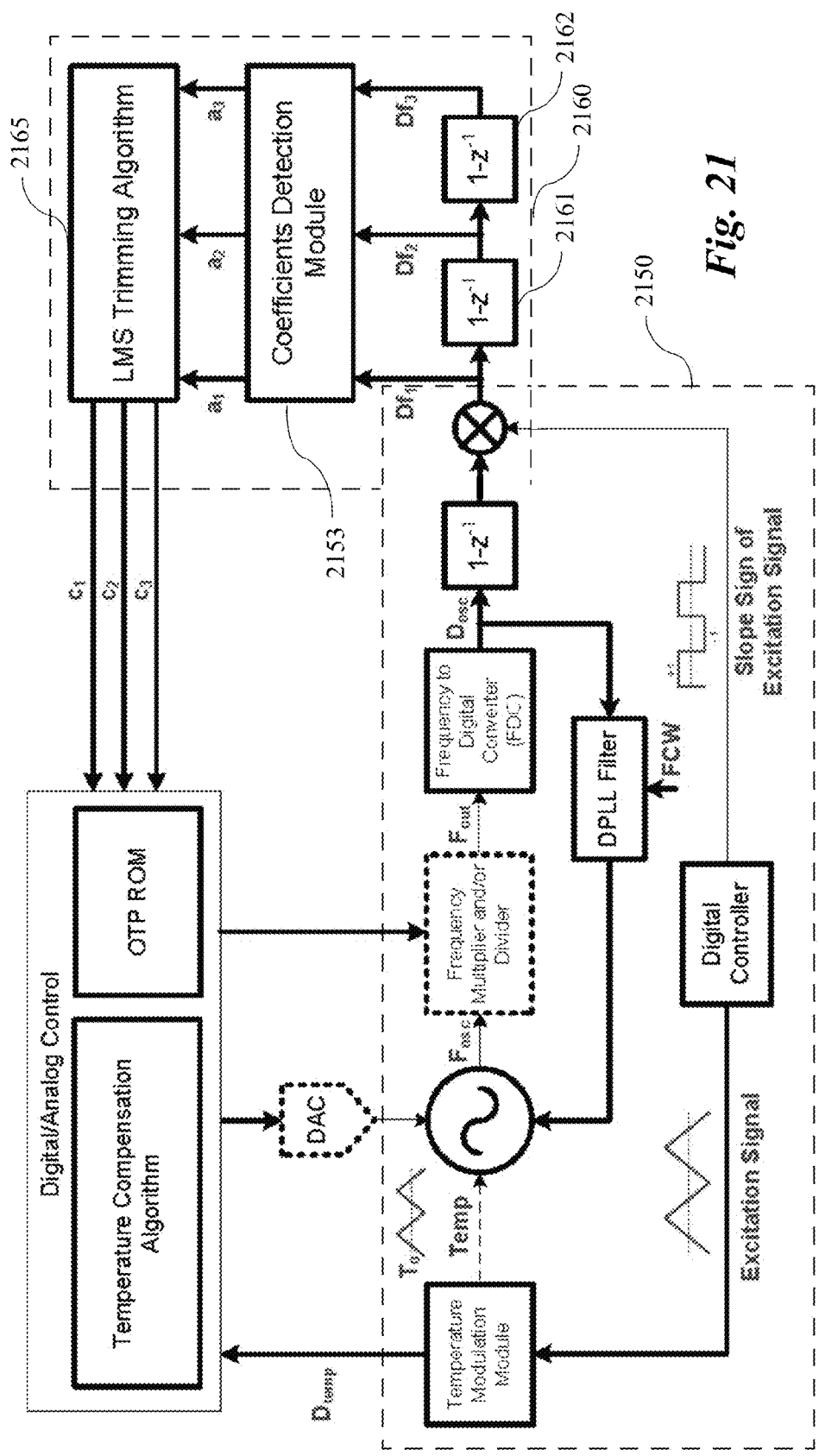
FIG. 21 is a diagram of a generalized calibration system for temperature compensation system.

FIG. 21 shows a top-level diagram of the SPT for TCO infrastructure based in part on a structure 2150 like that of the structure 550 of FIG. 5. The digital implementation of the SPT module may be highly programmable to accommodate different oscillators with different characteristics. A temperature triangular excitation signal superimposed over $T_o$ is applied to the oscillator through a temperature modulation module. The oscillator frequency will act in response to the temperature modulation signal according to its temperature dependence as described in equation (1). The FDC will convert the oscillator frequency into a digital word $D_{osc}$.

An LMS calibration block 2160 includes derivative blocks 2161 and 2162, a coefficients detection module 2163, and an LMS trimming algorithm 2165. As the excitation signal is a triangular wave, then the first derivative of frequency can be represented in a digital word ($Df_1$) using a difference block. The process can be extended to get higher derivatives ($Df_2$, $Df_3$). The coefficients detection module uses frequency derivatives ($Df_1$, $Df_2$ and $Df_3$) to estimate the oscillator's temperature dependence coefficients ($a_1$, $a_2$ and $a_3$). An LMS trimming algorithm can be used to search for the optimum compensation coefficients ($c_{1opt}$, $c_{2opt}$ and $c_{3opt}$) similar to FIG. 13(A).

The accuracy of the trimming algorithm depends on the amplitude of the temperature modulation waveform. As the amplitude of temperature modulation increase the total temperature dependence of the oscillator in the required temperature range increases. The oscillator output frequency can be readjusted after each modulation cycle by enabling the DPLL module to reacquire the required frequency $FCW \cdot f_{ref}$. Afterwards, the DPLL is disabled and the oscillator becomes free-running again to respond to the temperature modulation. The techniques described herein are capable of adjusting the optimum compensation parameter for minimum temperature dependence besides adjusting the oscillator output frequency at the same time.

The techniques described herein provide a smart, robust, and all-digital trimming solution for TCO thus decreasing the complexity of production testing and consequently decreasing the overall cost of the product.

What is claimed is:

1. An oscillator circuit comprising: an oscillator comprising a frequency determining element; frequency setting circuitry responsive to a digital frequency setting value to cause a change in an output frequency of the oscillator; phase setting circuitry responsive to a digital phase setting value to cause a specified phase across the frequency determining element; temperature modulation circuitry responsive to a calibration stimulus for causing a temperature of the oscillator to varying in accordance with a controlled temperature modulation pattern of alternating temperature increase and temperature decrease; memory to store the digital phase setting value and the digital frequency setting value; and calibration circuitry configured to determine and store in the memory the digital phase setting value and the digital frequency setting value so as to simultaneously satisfy a frequency accuracy requirement and a requirement of frequency stability over a specified temperature range.

2. The apparatus of claim 1, wherein the calibration stimulus is a square wave.

3. The apparatus of claim 1, wherein the calibration stimulus is a triangular wave.

4. The apparatus of claim 1, wherein the temperature modulation circuitry comprises a control loop comprising a plurality of heating elements and a temperature sensor.

5. The apparatus of claim 1, wherein the calibration circuitry comprises a control loop comprising a frequency-to-digital converter.

6. The apparatus of claim 1, wherein the oscillator circuitry and the temperature modulation circuitry are fabricated on a single integrated circuit.

7. The apparatus of claim 6, wherein the memory and at least a portion of the calibration circuitry are fabricated on the single integrated circuit.

8. A method of calibrating an oscillator for frequency-accurate, frequency-stable operation across a temperature range, the oscillator comprising a frequency determining element, circuitry responsive to a digital frequency setting value to cause a change in an output frequency of the oscillator, and circuitry responsive to a digital phase setting value to cause a specified phase across the frequency determining element, the method comprising: determining frequency differences at different instants of time between the output frequency of the oscillator and a reference frequency; under a temperature condition and under control of a first control loop, applying controlled temperature modulation to the oscillator in accordance with a pattern of alternating temperature increase and temperature decrease, determining a temperature sensitivity of the output frequency of the oscillator, and searching for and identifying a final digital phase setting value that results in a temperature sensitivity that matches a predetermined criterion; and under said temperature condition and under control of a second control loop, determining a final digital frequency setting value that minimizes the frequency differences; wherein the final digital phase setting value and the final digital frequency setting value simultaneously satisfy a frequency accuracy requirement and a requirement of frequency stability over a specified temperature range.

9. The method of claim 8, wherein the temperature condition is non-controlled room temperature.

10. The method of claim 8, wherein the first control loop uses feedback control to control an average temperature of the oscillator and a temperature modulation profile.

11. The method of claim 8, wherein the first control loop and the second control loop operate simultaneously, with a response time of the second control loop being much faster than a response time of the first control loop, further comprising: the second control loop locking the oscillator to the reference frequency; and the first control loop using changes in the digital frequency setting in response to the temperature modulation to search for and identify a final digital phase setting value that results in a temperature sensitivity that matches a predetermined criterion.

12. The method of claim 8, comprising repeating a plurality of times the steps of determining frequency differences, identifying a final digital phase setting value, and determining a final digital frequency setting value, each time under a different temperature condition.

13. The method of claim 8, wherein the first control loop and the second control loop operate in an interleaved manner in accordance with a period of the temperature modulation, with a response time of the second control loop being much faster than a response time of the first control loop, wherein the second control loop operates during a first portion of the period of the temperature modulation and does not operate during a second portion of the period of the temperature modulation.

14. The method of claim 8, wherein searching for the final digital phase setting value is performed using a successive approximation search algorithm.

15. The method of claim 8, wherein searching for the final digital phase setting value is performed using a least mean square search algorithm.

16. An apparatus comprising: an oscillator comprising a frequency determining element; circuitry responsive to a digital frequency setting value to cause a change in an output frequency of the oscillator; circuitry responsive to a digital phase setting value to cause a specified phase across the frequency determining element; circuitry to determine frequency differences at different instants of time between the output frequency of the oscillator and a reference frequency; control logic; a first control loop controlled by the control logic to, under a temperature condition, apply controlled temperature modulation to the oscillator in accordance with a pattern of alternating temperature increase and temperature decrease, determine a temperature sensitivity of the output frequency of the oscillator, and search for and identifying a final digital phase setting value that results in a temperature sensitivity that matches a predetermined criterion; and a second control loop controlled by the control logic to, under the temperature condition, determine a final digital frequency setting value that minimizes the frequency differences; wherein the final digital phase setting value and the final digital frequency setting value simultaneously satisfy a frequency accuracy requirement and a requirement of frequency stability over temperature.

\* \* \* \* \*